(12) United States Patent
Tsai et al.

(10) Patent No.: US 12,342,436 B2
(45) Date of Patent: Jun. 24, 2025

(54) LIGHT STRIP UNPLUG DETECTION CIRCUIT, LIGHT STRIP DRIVING SYSTEM, AND LIGHT STRIP UNPLUGGING PROTECTION METHOD

(71) Applicant: NUVOTON TECHNOLOGY CORPORATION, Hsinchu (TW)

(72) Inventors: Lian-Cheng Tsai, Zhubei (TW); Chun-Yi Wu, Zhubei (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 167 days.

(21) Appl. No.: 18/472,756

(22) Filed: Sep. 22, 2023

(65) Prior Publication Data

US 2024/0298392 A1 Sep. 5, 2024

(30) Foreign Application Priority Data

Mar. 3, 2023 (TW) ................................. 112107895

(51) Int. Cl.
*H05B 45/50* (2022.01)
*F21V 23/06* (2006.01)
(Continued)

(52) U.S. Cl.
CPC ............. *H05B 45/50* (2020.01); *F21V 23/06* (2013.01); *G01R 31/69* (2020.01); *H05B 45/10* (2020.01); *H05B 45/325* (2020.01)

(58) Field of Classification Search
CPC .... H05B 45/325; H05B 45/36; H05B 45/375; H05B 45/38; H05B 45/50; H05B 45/20; H05B 45/10; H05B 45/59; H05B 45/345; H05B 45/34; H05B 45/3578; H05B 45/18; H05B 45/22; H05B 45/24; H05B 45/37; H05B 47/105; H05B 47/11; H05B 47/115; H05B 47/16; H05B 47/19; H05B 47/196; H05B 47/198; H05B 47/1985; H05B 45/32; H05B 45/3725; H05B 47/26; F21V 23/003; F21V 15/015; F21V 23/005; F21V 23/02; F21V 23/023; F21V 25/02; F21V 29/70;
(Continued)

(56) References Cited

U.S. PATENT DOCUMENTS 10,054,271 B2 *  8/2018  Xiong .................... F21K 9/275
10,281,092 B2 *  5/2019  Xiong .................... H05K 1/00
(Continued)

*Primary Examiner* — Monica C King
(74) *Attorney, Agent, or Firm* — Muncy, Geissler, Olds & Lowe, P.C.

(57) ABSTRACT

A light strip unplugging protection method includes: providing a light strip, wherein the light strip includes a plug including a power pin and a control pin; providing a socket corresponding to the plug, wherein the socket includes a power pin holder and at least one light strip control pin holder for electrically connecting with the power pin and the light strip control pin respectively; using a pulse-width modulation signal to drive the light strip on the light strip control pin holder to control the current passing therethrough; and when the pulse-width modulation signal is in a first state, detecting voltage or current of the light strip control pin holder; determining whether the light strip is unplugged according to the voltage or current; and when it is determined that the light strip is unplugged, power voltage on the power pin holder is turned off.

13 Claims, 5 Drawing Sheets

(51) Int. Cl.
*G01R 31/69* (2020.01)
*H05B 45/10* (2020.01)
*H05B 45/325* (2020.01)

(58) Field of Classification Search
CPC ........ F21V 29/83; F21V 3/061; F21V 19/006; F21V 23/06; F21V 29/77; F21V 3/00; F21V 31/00; F21V 7/00; F21Y 2115/10; F21Y 2103/10; H05K 1/00; H05K 1/189; H05K 2201/10106; H05K 3/363; H05K 1/147; H05K 1/14; H05K 2201/09027
See application file for complete search history.

(56) References Cited

U.S. PATENT DOCUMENTS

| | | | |
|---|---|---|---|
| 12,104,754 B2 * | 10/2024 | Xiong | F21V 3/061 |
| 2016/0131312 A1 * | 5/2016 | May | F21S 8/046 |
| | | | 362/218 |
| 2017/0321849 A1 * | 11/2017 | Xiong | H05B 45/345 |
| 2019/0017661 A1 * | 1/2019 | Xiong | H05B 45/50 |
| 2023/0020744 A1 * | 1/2023 | Chen | H02J 15/00 |
| 2024/0093841 A1 * | 3/2024 | Xiong | F21V 23/005 |
| 2025/0035271 A1 * | 1/2025 | Xiong | F21V 23/023 |

* cited by examiner

LIGHT STRIP UNPLUG DETECTION CIRCUIT, LIGHT STRIP DRIVING SYSTEM, AND LIGHT STRIP UNPLUGGING PROTECTION METHOD

FIELD OF THE INVENTION

The invention relates to a light driving technology, and more particularly, to a light strip unplugging detection circuit, a light strip driving system and a light strip unplugging protection method.

BACKGROUND OF THE INVENTION

Due to the progressing of technologies, lighting equipment has been embellished with aesthetic design in addition to just illumination purposes. For example, at present, most motherboards for personal computers have specially designed neon strip driving circuits and dedicated sockets for driving the LED light strips. Users can set the brightness and/or color of LED light strips in the BIOS of the motherboard.

FIG. 1 is a diagram illustrating a plug of an LED light strip according to a related art technique. At present, the light strips on the market are mostly 12V red, green and blue (RGB) light strips with 4 pins. This light strip mainly four pins including +12V, green control line G, red control line R and blue control line B. The +12V pin provides the power needed for lighting the LEDs inside the light strip, and the green control line G, the red control line R and the blue control line B are controlled by external circuits to light the corresponding LEDs inside the light strip after the circuit loop is formed.

It can be seen from the above that the 12V and RGB pins on the light strip interface do not have the function of informing the system whether the light strip is plugged or unplugged (i.e., the plug/unplug detection), and most manuals of the motherboards also prohibit users from hot unplugging/unplugging after the motherboard is powered on. As users tend not to thoroughly read the instructions, they often perform hot unplugging when replacing the 12V RGB light strip. This way of replacing the light strip could raise the risks of burning the light strip driving circuit and damaging of the entire motherboard.

SUMMARY OF THE INVENTION

The invention provides a light strip unplugging detection circuit, a light strip driving system, and a light strip unplugging protection method, which are used for protecting the driving system after the light strip is unplugged from a socket when the light strip is powered on by the user, so that the light strip or the driving system can be prevented from being damaged when the user inserts the light strip once again.

An embodiment of the present invention provides a light strip unplugging detection circuit for detecting whether a light strip is unplugged. The light strip comprises a plug, the plug comprises a power pin and at least one light strip control pin, and light strip unplugging detection circuit comprises a socket, a driving control logic circuit, a switch circuit and a comparison circuit. The socket is corresponding to the plug, and comprises a power pin holder and at least one light strip control pin holder, the power pin holder is configured to electrically connect to the power pin, and the at least one light strip control pin holder is configured to electrically connect to the light strip control pin. The power pin holder is electrically connected to a power voltage. The driving control logic circuit is configured to output at least one pulse-width modulation signal. The switch circuit having a first terminal, a second terminal and a control terminal, wherein the first terminal of the switch circuit is electrically connected to the light strip control pin holder, the second terminal of the switch circuit is electrically connected to a common voltage, and the control terminal of the switch circuit receives the pulse-width modulation signal. The comparison circuit is electrically connected to the driving control logic circuit and the light strip control pin holder. When the pulse-width modulation signal outputted by the driving control logic circuit is in a first state, the driving control logic circuit controls the comparison circuit to detect the voltage or current of the light strip control pin holder to determine whether the light strip is unplugged. When the driving control logic circuit determines that the light strip is unplugged, the driving control logic circuit turns off the power voltage.

The embodiment of the present invention further provides alight strip driving system for driving light strips. The light strip comprises a plug, and the plug comprises a power pin and at least one light strip control pin. The light strip driving system comprises a socket, a power supply circuit, a driving control logic circuit, a switching circuit and a comparison circuit. The socket is corresponding to the plug, and comprises a power pin holder and at least one light strip control pin holder, the power pin holder is configured to electrically connect to the power pin, and the at least one light strip control pin holder is configured to electrically connect to the light strip control pin. The power supply circuit outputs a power voltage, and the power pin holder is electrically connected to the power voltage. The driving control logic circuit is configured to output at least one pulse-width modulation signal to control the brightness of a light strip electrically connected to the socket. The switch circuit has a first terminal, a second terminal and a control terminal, wherein the first terminal of the switch circuit is electrically connected to the light strip control pin holder, the second terminal of the switch circuit is electrically connected to a common voltage, and the control terminal of the switch circuit receives the pulse-width modulation signal. The comparison circuit is electrically connected to the driving control logic circuit and the light strip control pin holder. When the pulse-width modulation signal outputted by the driving control logic circuit is in a first state, the driving control logic circuit controls the comparison circuit to detect voltage or current of the light strip control pin holder to determine whether the light strip is unplugged. When the driving control logic circuit determines that the light strip is unplugged, the driving control logic circuit turns off the power voltage.

According to the light strip unplugging detection circuit and the light strip driving system according to the preferred embodiment of the present invention, the light strip unplugging detection circuit and the light strip driving system further comprise a controllable power switch. The controllable power switch has a first terminal, a second terminal and a control terminal, wherein the control terminal of the controllable power switch is electrically connected to the driving control logic circuit, the first terminal of the controllable power switch is electrically connected to the power voltage, and the second terminal of the controllable power switch is electrically connected to the power pin holder. When the driving control logic circuit determines that the light strip is unplugged, the driving control logic circuit controls the first terminal and the second terminal of the controllable power switch to be disconnected from each other via the control terminal of the controllable power switch.

According to the light strip unplugging detection circuit and the light strip driving system according to the preferred embodiment of the present invention, the light strip unplugging detection circuit and the light strip driving system further comprise a detection enabling switch circuit. The detection enabling switch circuit has a first terminal, a second terminal and a control terminal. The control terminal of the detection enabling switch circuit is electrically connected to the driving control logic circuit, the first terminal of the detection enabling switch circuit is electrically connected to the light strip control pin holder, and the second terminal of the detection enabling switch circuit is electrically connected to the comparison circuit. When the pulse-width modulation signal outputted by the driving control logic circuit is in the first state, the detection enabling switch circuit is turned on. When the pulse-width modulation signal outputted by the driving control logic circuit is in a second state, the detection enabling switch circuit is turned off.

According to the light strip unplugging detection circuit and the light strip driving system according to the preferred embodiment of the present invention, the comparison circuit comprises a low-driving negative voltage source and a comparator. The low-driving negative voltage source is configured to provide a negative voltage. The comparator has a first input terminal, a second input terminal and an output terminal. The first input terminal of the comparator is electrically connected to the second terminal of the detection enabling switch circuit and the low-driving negative voltage source, the second terminal of the comparator receives a reference voltage, and the output terminal of the comparator outputs a comparison signal.

According to the light strip unplugging detection circuit and the light strip driving system according to the preferred embodiment of the present invention, the plug comprises a plurality of light strip control pins, and the socket has a plurality of light strip control pin holders for electrically connecting with the light strip control pins respectively, wherein the light strip unplugging detection circuit further comprises a plurality of switch circuits. Each of the switch circuits has a first terminal, a second terminal and a control terminal, wherein the first terminals of the switch circuits are electrically connected to the light strip control pin holders respectively, and the second terminals of the switch circuits are electrically connected to the common voltage. The driving control logic circuit is configured to output a plurality of pulse-width modulation signals. The control terminals of the switch circuits respectively receive the pulse-width modulation signals.

The embodiment of the invention additionally provides a light strip unplugging protection method, which comprises: providing a light strip, wherein the light strip comprises a plug, and the plug comprises a power pin and at least one light strip control pin; providing a socket corresponding to the plug, wherein the socket comprises a power pin holder and at least one light strip control pin holder, the power pin holder is configured to electrically connect to the power pin, and the at least one light strip control pin holder is configured to electrically connect to the light strip control pin; using a pulse-width modulation signal to drive the light strip on the light strip control pin holder to control the current passing therethrough; when the pulse-width modulation signal is in a first state, detecting voltage or current of the light strip control pin holder; determining whether the light strip is unplugged according to the voltage or current; and when it is determined that the light strip is unplugged, turning off power voltage on the power pin holder.

The method for unplugging and protecting the light strip comprises the following steps: providing a light strip, wherein the light strip comprises a plug, and the plug comprises a power pin and at least one light strip control pins; Providing a socket, corresponding to the plug, with a power pin holder and at least one light strip control pin holder, the power pin holder is configured to electrically connect to the power pin, and the at least one light strip control pin holder is configured to electrically connect to the light strip control pin; Using a pulse-width modulation signal to drive the light strip to control the light strip on the pin holder to control the current; When the pulse-width modulation signal is in a first state, detecting the voltage or current of the light strip control pin holder; Determining whether the light strip is unplugged according to the voltage or current; And turning off the power voltage on the power pin holder when it is determined that the light strip is unplugged.

The method for unplugging and protecting the light strip according to the preferred embodiment of the present invention further comprises: providing a switch circuit, wherein a first terminal of the switch circuit is electrically connected to the light strip control pin holder, and a second terminal of the switch circuit is electrically connected to a common voltage; when the pulse-width modulation signal is in the first state, controlling the first terminal of the switch circuit to be cut off from the second terminal of the switch circuit; and when the pulse-width modulation signal is in a second state, controlling the first terminal of the switch circuit is controlled to electrically connect the second terminal of the switch circuit. In another preferred embodiment, when the pulse-width modulation signal is in the first state, the step of detecting the voltage or current of the light strip control pin holder comprises: providing a negative voltage source with low-driving capability; and when the pulse-width modulation signal is in the first state, turning on a circuit between the light strip control pin holder and the negative voltage source with low-driving capability, to detect a load of the light strip control pin holder.

To sum up, the embodiment of the present invention uses the light strip control pin holder in the socket of the light strip to electrically connect to a detection circuit. When driving the light strip, the present application simultaneously detects whether the light strip is unplugged by the user, and drives using a pulse-width modulation method to control the current flowing through the lighting element of the light strip, and therefore when under the pulse-width modulation, theoretically there is no current. In this way, the session with no current can be used to detect whether the light strip is plugged in the socket. If the light strip is unplugged from the socket by the user when the device is powered on, the power supply will be turned off, thereby protecting the driving system and avoiding damaging the light strip or the driving system when the user inserts the light strip once again.

In order to further facilitate understanding of the techniques, means and effects of the present invention, reference can be made to the following detailed description and drawings, so that the purpose, features and concepts of the present invention can be thoroughly and concretely understood. However, the following detailed description and the accompanying drawings are only for referencing and illustrative purposes, rather than limiting the scope of the present invention.

BRIEF DESCRIPTION OF THE DRAWINGS

The accompanying drawings are provided for further understanding of the invention by one skilled in the art, and are incorporated to constitute a part of the specification of the invention. The accompanying drawings are used to illustrate exemplary embodiments of the invention, and are used with the description to explain the principles of the invention.

DETAILED DESCRIPTION OF PREFERRED EMBODIMENTS

Figure 1:
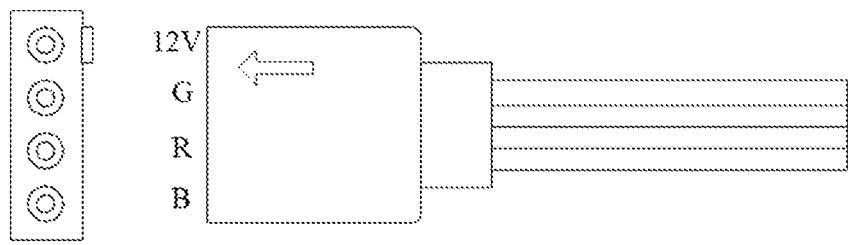
FIG. 1 is a diagram illustrating a plug of an LED light strip according to a related art technique.

Reference can be made in detail to exemplary embodiments of the present invention, which are illustrated in the accompanying drawings. Wherever possible, the same symbol used in the drawings and the description represent the same or similar elements. In addition, the exemplary embodiments are merely an illustration of how put the present invention into practice, rather than limitations.

Figure 2:
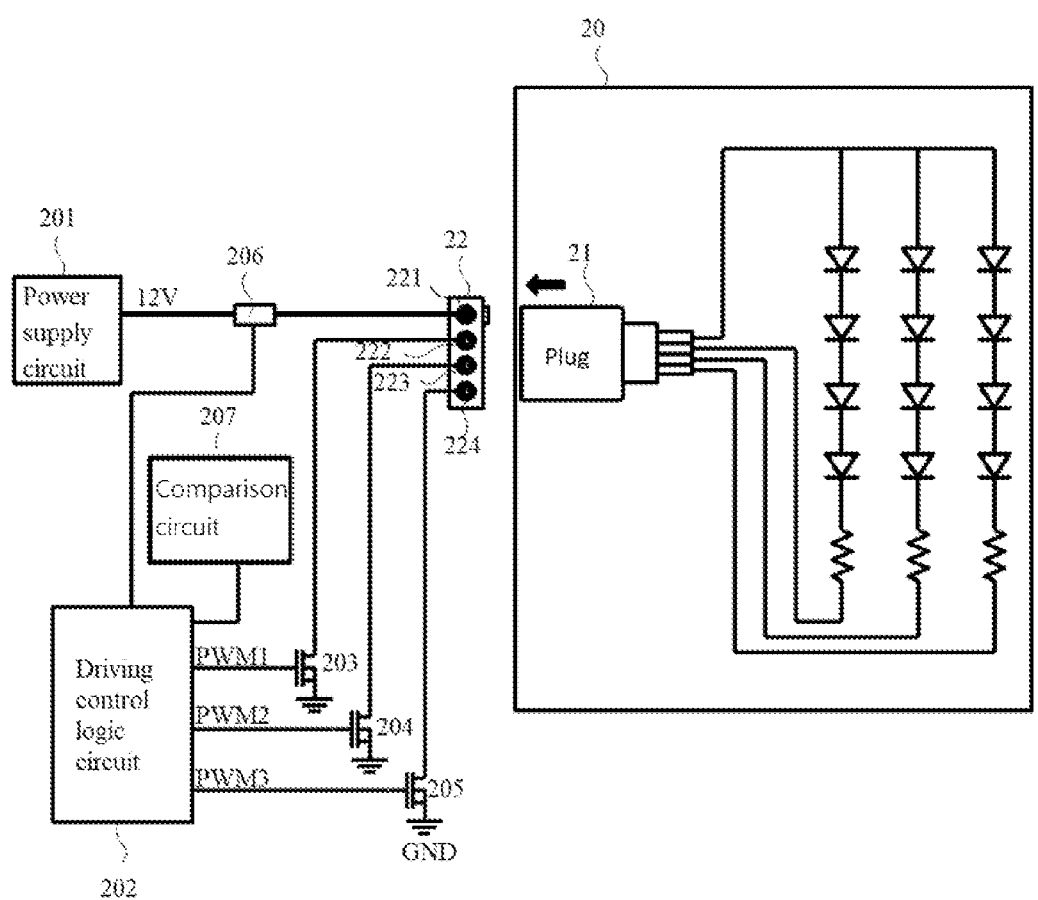
FIG. 2 is a block diagram of a light strip driving system according to a preferred embodiment of the present invention.

FIG. 2 is a block diagram of a light strip driving system according to a preferred embodiment of the present invention. Please refer to FIG. 2. In this embodiment, the light strip driving system is used to drive the light strip 20. The light strip 20 comprises a plug 21, such as the plug in FIG. 1, which comprises a 12V power pin and three light strip control pins. In this embodiment, the light strips with three colors red, green and blue (RGB) are taken as an example. However, the person with ordinary knowledge in the art should know that the number of control pins of the light strip can be varied according to the difference between the light strip 20 and the light strip driving system, and the present invention is not limited to the illustrated number of control pins.

The light strip driving system comprises a socket 22, a power supply circuit 201, a driving control logic circuit 202, switch circuits 203-205, a controllable power switch 206 and a comparison circuit 207. The socket 22 is corresponding to the plug 21, and comprises a power pin holder 221 and three light strip control pin holders 222-224. The power pin holder 221 is used to electrically connect to the power pin of the plug 21 of the light strip 20, and the three light strip control pin holders 222-224 are used to connect the light strip control pin of the plug 21 of the light strip 20. The power supply circuit 201 outputs a power voltage of 12V, which is transmitted to the power pin holder 221 through the controllable power switch 206, to provide the power voltage of 12V required by the coupled light strip 20.

The driving control logic circuit 202 outputs three pulse-width modulation signals PWM1-PWM3, which are used to control the brightness of the light-emitting diodes (LEDs) in the light strip 20 electrically connected to the socket. The first terminal of the switch circuit 203 is electrically connected to the light strip control pin holder 222, the second terminal of the switch circuit 203 is electrically connected to the common voltage GND, and the control terminal of the switch circuit 203 is configured to receive the pulse-width modulation signal PWM1. The first terminal of the switch circuit 204 is electrically connected to the light strip control pin holder 223, the second terminal of the switch circuit 204 is electrically connected to the common voltage GND, and the control terminal of the switch circuit 204 is configured to receive the pulse-width modulation signal PWM2. The first terminal of the switch circuit 205 is electrically connected to the light strip control pin holder 224, the second terminal of the switch circuit 205 is electrically connected to the common voltage GND, and the control terminal of the switch circuit 205 is configured to receive the pulse-width modulation signal PWM3. The comparison circuit 207 is electrically connected to the driving control logic circuit 202 and the light strip control pin holders 222-224.

In this embodiment, as the brightness of the red, green and blue (R, G, B) light-emitting diodes of the light strip 20 is controlled by the pulse-width modulation signals PWM1-PMW3, when the pulse-width modulation signal PWM1 is in a logic-high voltage state, the switch circuit 203 is in a turned-on state; and when the pulse-width modulation signal PWM1 is in a logic-low voltage state, the switch circuit 203 is in a turned-off state. The driving control logic circuit 202 controls the on time of the switch circuit 203 by controlling the duration of the logic-high voltage state of the pulse-width modulation signal PWM1. As the turned on duration of the switch circuit 203 is controlled, the average current of the corresponding LED string is thus also controlled, thereby controlling the brightness of the corresponding color. However, when the switch circuit 203 is turned on, the current will be directly turned on to the common voltage GND. Therefore, in this embodiment, only when the PWM signal PWM1 is in a logic-low voltage state, that is, the switch circuit 203 is turned off, the driving control logic circuit 202 controls the comparison circuit 207 to detect and determine whether the light strip is unplugged. Since the switch circuit 203 is already turned off, the comparison circuit 207 can detect the voltage or current of the light strip control pin holder at this moment to determine whether the light strip 20 is unplugged. When it is detected that the light strip 20 is unplugged by the user, the driving control logic circuit 202 turns off the controllable power switch 206 to stop supplying 12V power voltage to the power pin socket 221. Although the above embodiment mainly illustrates the off-state of the switch circuit 203, one skilled in the art should be able to conclude that the driving control logic circuit 202 can also detect the off-state through the switch circuit 204 or 205.

Figure 3:
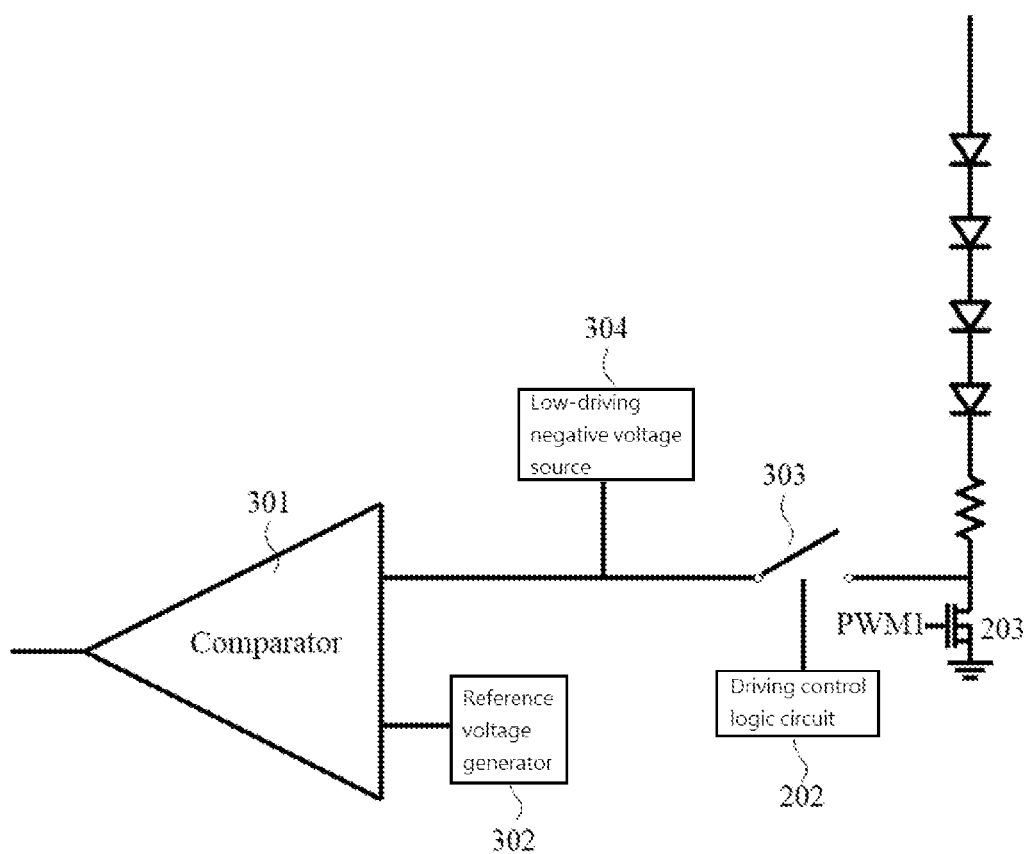
FIG. 3 is a schematic diagram of a comparison circuit of a light strip driving system according to a preferred embodiment of the present invention.

FIG. 3 is a schematic diagram of a comparison circuit 207 of a light strip driving system according to a preferred embodiment of the present invention. Please refer to FIG. 3. In this embodiment, the comparison circuit 207 comprises a comparator 301, a reference voltage generator 302, a detection enabling switch circuit 303 and a low-driving negative voltage source 304. In this embodiment, the control terminal of the detection enabling switch circuit 303 is electrically connected to the driving control logic circuit 202, the first terminal of the detection enabling switch circuit 303 is electrically connected to the light strip control pin holder 202, and the second terminal of the detection enabling switch circuit 303 is electrically connected to the first input terminal of the comparator 301. The first input of the comparator 301 receives the negative voltage generated by the low-driving negative voltage source 304, and the second input of the comparator 301 receives the reference voltage Vref generated by the reference voltage generator 302. The driving control logic circuit 202 controls the first terminal and the second terminal of the detection enabling switch circuit 303 to be conductive when the pulse-width modulation signal PWM1 is in a logic-low voltage state. At this moment, given that the plug 21 of the light strip 20 is inserted into the socket 22, the current of the LED will flow into the first input of the comparator 301 because the first input of the comparator 301 receives the negative voltage generated by the low-driving negative voltage source 304. The comparator 301 changes the state of the output signal of the comparator 301 by comparing the reference voltage Vref with the voltage and current formed by the LED flowing into the low-driving negative voltage source. At this moment, the driving control logic circuit 202 can determine that the light strip 20 has not been unplugged.

Similarly, given that the plug 21 of the light strip 20 is not plugged into the socket 22, the first input terminal of the comparator 301 only receives the negative voltage generated by the low-driving negative voltage source 304, and the current without LED will flow into the first input terminal of the comparator 301. The comparator 301 compares the reference voltage Vref with the negative voltage generated by the low-driving negative voltage source 304, so that the state of the output signal of the comparator 301 will not be changed. At this moment, the driving control logic circuit 202 can determine that the light strip 20 has been unplugged, and then it can control the controllable power switch 206 to turn off, so as to stop the supply of the 12V power voltage to the power pin holder 221.

In the above embodiment, although the controllable power switch 206 is used to control the supply of the 12V power voltage, the person with ordinary knowledge in the art should know that if the power supply circuit 201 is a power supply circuit with the function of turning off the power output, the controllable power switch 206 is not necessarily used. Note that the illustrated light strip 20 is with the pins of 12V, red, green and blue (RGB) in this embodiment, thus three switch circuits 203-205, three light strip control pin holders 222-224 and three pulse-width modulation signals PWM1-PWM3 are correspondingly provided. However, the person with ordinary knowledge in the art should know that if the light strip 20 only has a string of LEDs, the entire circuit will be correspondingly modified into one switch circuit, one light strip control pin holder and one pulse-width modulation signal. Therefore, the present invention is not limited to the illustrated numbers of the elements. Furthermore, although in the preferred embodiment, the low-driving negative voltage source 304, the comparator 301 and other circuits are illustrated, the person with ordinary knowledge in the art should know that the comparison circuit 207 may have various other implementations, so the present invention is not limited to the illustrated design.

Figure 4:
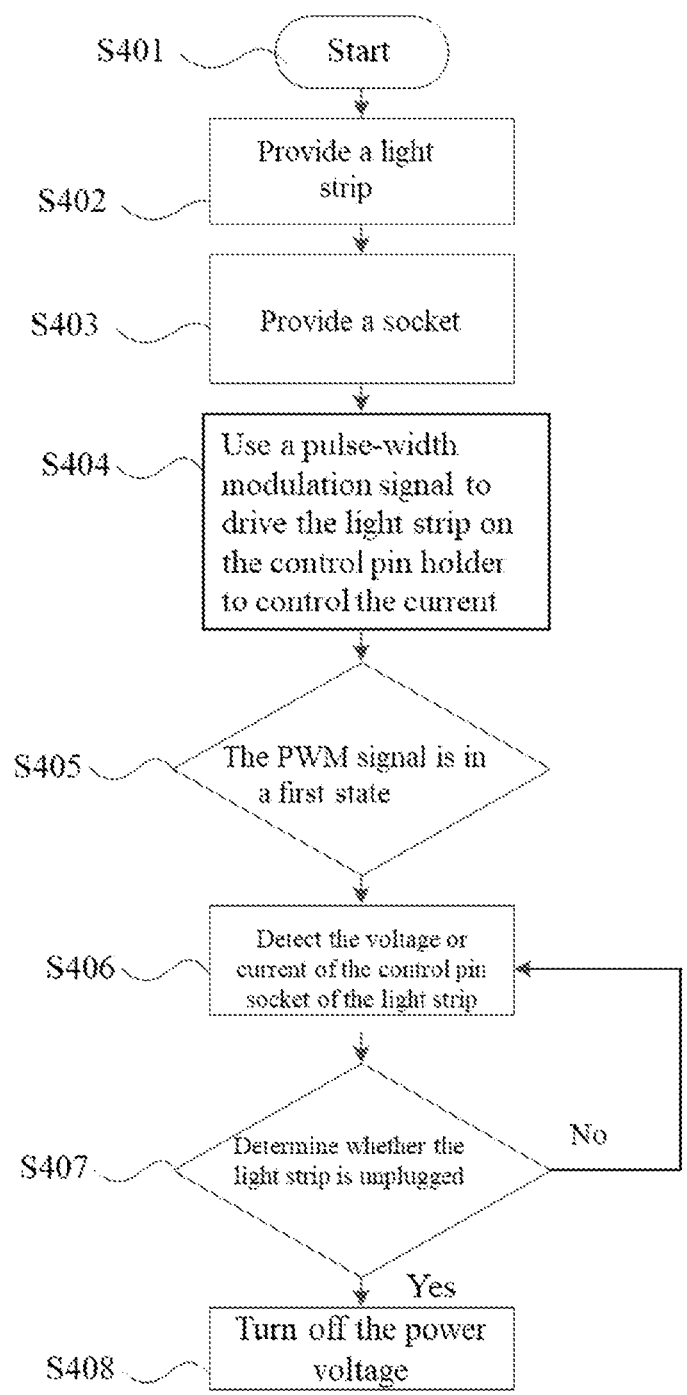
FIG. 4 is a flowchart of a light strip unplugging protection method according to a preferred embodiment of the present invention.

According to the above embodiments, the present invention can be summarized as a light strip unplugging protection method. FIG. 4 is a flowchart of a light strip unplugging protection method according to a preferred embodiment of the present invention. Please refer to FIG. 4. The method for unplugging and protecting the light strip comprises the following steps:

Step S401: Start. Under normal circumstances, this light strip unplugging protection method can be implemented after the machine is performed with power on reset (POR).

Step S402: Provide light strips. As mentioned in the above embodiment, the light strip 20 comprises a plug 21, and the plug 21 comprises a power pin and at least one light strip control pin.

Step S403: Provide a socket. As mentioned in the above embodiment, the socket 22 corresponds to the plug 21, and has a power pin holder and at least one Light control pin holder respectively used for electrically connecting the power pin and the light strip control pin.

Step S404: Use a pulse-width modulation signal to drive the light strip on the control pin holder to control the current.

Step S405: Determine whether the pulse-width modulation signal is in a first state. When the pulse-width modulation signal is in a first state, Step S406 is performed.

Step S406: Detect the voltage or current of the control pin socket of the light strip. As shown in the above embodiment, the driving control logic circuit 202 controls the comparison circuit 207 to detect the voltage or current of the light strip control pin holder when the pulse-width modulation signal PWM1 is at a logic-low voltage state. Furthermore, as shown in FIG. 3, by using the detection enabling switch circuit, when the pulse-width modulation signal PWM1 is at a logic-low voltage state, the detection enabling switch circuit is turned on; and when the pulse-width modulation signal PWM1 is at a logic-high voltage state, the detection enabling switch circuit is turned off, thereby detecting the voltage or current of the light strip control pin holder.

Step S407: According to the voltage or current, it is determined whether the light strip is unplugged. When it is determined that the light strip is unplugged, the flow goes to Step S408.

Step S408: Turn off the power voltage on the power pin holder.

Figure 5:
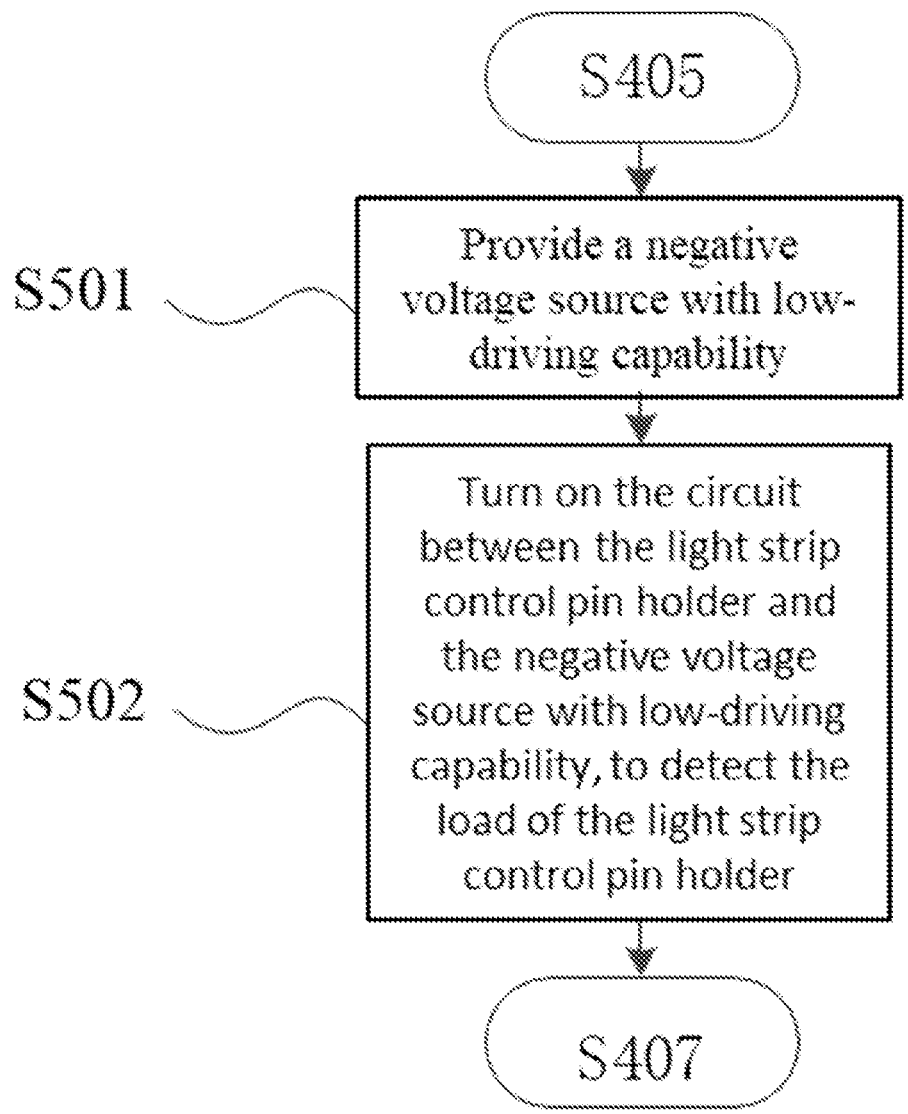
FIG. 5 is a flowchart illustrating the sub-steps of Step S406 of the light strip unplugging protection method according to a preferred embodiment of the present invention.

FIG. 5 is a flowchart illustrating the sub-steps of Step S406 of the light strip unplugging protection method according to a preferred embodiment of the present invention. Please refer to FIG. 5, Step S406 comprises the following steps (indicating that there is no error, the previous step of Step S406 is S405, and the subsequent step of Step S406 is also correct after Step S407):

Step S501: Provide a negative voltage source with low-driving capability, as shown in FIG. 3.

Step S502: When the pulse-width modulation signal is in the first state, the circuit between the light strip control pin holder and the negative voltage source with low-driving capability is turned on to detect the load of the light strip control pin holder. As shown in FIG. 3, when a current flowing into the first input terminal of the comparator (low-driving negative voltage source 304) is detected, it means that there is a load and the light strip is still in the socket. Otherwise, the light strip is unplugged.

To sum up, the embodiment of the present invention uses the light strip control pin holder in the socket of the light strip to electrically connect to a detection circuit. When driving the light strip, the present application simultaneously detects whether the light strip is unplugged by the user, and drives using a pulse-width modulation method to control the current flowing through the lighting element of the light strip, and therefore when under the pulse-width modulation, theoretically there is no current. In this way, the session with no current can be used to detect whether the light strip is plugged in the socket. If the light strip is unplugged from the socket by the user when the device is powered on, the power supply will be turned off, thereby protecting the driving system and avoiding damaging the light strip or the driving system when the user inserts the light strip once again.

It should be understood that the examples and embodiments described herein are for illustrative purposes only, and various modifications or changes based on the embodiments can be made to the person with ordinary knowledge in the art. However, modifications or changes are covered by the spirit of the invention and within the scope of the appended claims.

What is claimed is:

1. A light strip unplugging detection circuit for detecting whether a light strip is unplugged, wherein the light strip comprises a plug, the plug comprises a power pin and at least one light strip control pin, and light strip unplugging detection circuit comprises:
   a socket comprising a power pin holder and at least one light strip control pin holder, wherein the power pin holder is configured to electrically connect to the power pin, and the at least one light strip control pin holder is configured to electrically connect to the light strip control pin, wherein the power pin holder is electrically connected to a power voltage;
   a driving control logic circuit configured to output at least one pulse-width modulation signal;
   a switch circuit having a first terminal, a second terminal and a control terminal, wherein the first terminal of the switch circuit is electrically connected to the light strip control pin holder, the second terminal of the switch circuit is electrically connected to a common voltage, and the control terminal of the switch circuit receives the pulse-width modulation signal; and
   a comparison circuit, electrically connected to the driving control logic circuit and the light strip control pin holder,
   wherein when the pulse-width modulation signal outputted by the driving control logic circuit is in a first state, the driving control logic circuit controls the comparison circuit to detect the voltage or current of the light strip control pin holder to determine whether the light strip is unplugged;
   wherein when the driving control logic circuit determines that the light strip is unplugged, the driving control logic circuit turns off the power voltage.

2. The light strip unplugging detection circuit according to claim 1, further comprising:
   a controllable power switch having a first terminal, a second terminal and a control terminal, wherein the control terminal of the controllable power switch is electrically connected to the driving control logic circuit, the first terminal of the controllable power switch is electrically connected to the power voltage, and the second terminal of the controllable power switch is electrically connected to the power pin holder,
   wherein when the driving control logic circuit determines that the light strip is unplugged, the driving control logic circuit controls the first terminal and the second terminal of the controllable power switch to be disconnected from each other via the control terminal of the controllable power switch.

3. The light strip unplugging detection circuit according to claim 1, further comprising:
   a detection enabling switch circuit comprising a first terminal, a second terminal and a control terminal, wherein the control terminal of the detection enabling switch circuit is electrically connected to the driving control logic circuit, the first terminal of the detection enabling switch circuit is electrically connected to the light strip control pin holder, and the second terminal of the detection enabling switch circuit is electrically connected to the comparison circuit;
   wherein when the pulse-width modulation signal outputted by the driving control logic circuit is in the first state, the detection enabling switch circuit is turned on;
   wherein when the pulse-width modulation signal outputted by the driving control logic circuit is in a second state, the detection enabling switch circuit is turned off.

4. The light strip unplugging detection circuit according to claim 3, wherein the comparison circuit comprises:
   a low-driving negative voltage source configured to provide a negative voltage; and
   a comparator having a first input terminal, a second input terminal and an output terminal, wherein the first input terminal of the comparator is electrically connected to the second terminal of the detection enabling switch circuit and the low-driving negative voltage source, the second terminal of the comparator receives a reference voltage, and the output terminal of the comparator outputs a comparison signal.

5. The light strip unplugging detection circuit according to claim 1, wherein the plug comprises a plurality of light strip control pins, and the socket comprises a plurality of light strip control pin holders, the power pin holder is configured to electrically connect to the power pin, and the at least one light strip control pin holder is configured to electrically connect to the light strip control pin, and the light strip unplugging detection circuit further comprises:
   a plurality of switch circuits, wherein each of the switch circuits has a first terminal, a second terminal and a control terminal, wherein the first terminals of the switch circuits are electrically connected to the light strip control pin holders respectively, and the second terminals of the switch circuits are electrically connected to the common voltage;
   wherein the driving control logic circuit is configured to output a plurality of pulse-width modulation signals;
   wherein the control terminals of the switch circuits respectively receive the pulse-width modulation signals.

6. A light strip driving system for driving light strips, wherein the light strip comprises a plug, and the plug comprises a power pin and at least one light strip control pin, and the light strip driving system comprises:
   a socket comprising a power pin holder and at least one light strip control pin holder, wherein the power pin holder is configured to electrically connect to the power pin, and the at least one light strip control pin holder is configured to electrically connect to the light strip control pin;
   a power supply circuit outputting a power voltage, wherein the power pin holder is electrically connected to the power voltage;
   a driving control logic circuit for outputting at least one pulse-width modulation signal to control brightness of a light strip electrically connected to the socket;
   a switch circuit having a first terminal, a second terminal and a control terminal, wherein the first terminal of the switch circuit is electrically connected to the light strip control pin holder, the second terminal of the switch circuit is electrically connected to a common voltage, and the control terminal of the switch circuit receives the pulse-width modulation signal; and
   a comparison circuit electrically connected to the driving control logic circuit and the light strip control pin holder,
   wherein when the pulse-width modulation signal outputted by the driving control logic circuit is in a first state, the driving control logic circuit controls the comparison circuit to detect voltage or current of the light strip control pin holder to determine whether the light strip is unplugged;

wherein when the driving control logic circuit determines that the light strip is unplugged, the driving control logic circuit turns off the power voltage.

7. The light strip driving system according to claim 6, further comprising:

a controllable power switch having a first terminal, a second terminal and a control terminal, wherein the control terminal of the controllable power switch is electrically connected to the driving control logic circuit, the first terminal of the controllable power switch is electrically connected to the power supply circuit to receive the power voltage, and the second terminal of the controllable power switch is electrically connected to the power pin holder;

wherein when the driving control logic circuit determines that the light strip is unplugged, the driving control logic circuit controls the first terminal and the second terminal of the controllable power switch to be disconnected from each other via the control terminal of the controllable power switch.

8. The light strip driving system according to claim 6, further comprising:

a detection enabling switch circuit has a first terminal, a second terminal and a control terminal, wherein the control terminal of the detection enabling switch circuit is electrically connected to the driving control logic circuit, the first terminal of the detection enabling switch circuit is electrically connected to the light strip control pin holder, and the second terminal of the detection enabling switch circuit is electrically connected to the comparison circuit;

wherein when the pulse-width modulation signal outputted by the driving control logic circuit is in the first state, the detection enabling switch circuit is turned on;

wherein when the pulse-width modulation signal outputted by the driving control logic circuit is in a second state, the detection enabling switch circuit is turned off.

9. The light strip driving system according to claim 8, wherein the comparison circuit comprises:

a low-driving negative voltage source configured to provide a negative voltage; and a comparator comprising a first input terminal, a second input terminal and an output terminal, wherein the first input terminal of the comparator is electrically connected to the second terminal of the detection enabling switch circuit and the low-driving negative voltage source, the second terminal of the comparator receives a reference voltage, and the output terminal of the comparator outputs a comparison signal.

10. The light strip driving system according to claim 6, wherein the plug comprises a plurality of light strip control pins, and the socket has a plurality of light strip control pin holders which are respectively used for the light strip control pins, wherein the light strip driving system further comprises:

a plurality of switch circuits, wherein each of the switch circuits has a first terminal, a second terminal and a control terminal, wherein the first terminals of the switch circuits are electrically connected to each of the light strip control pin holders respectively, and the second terminals of the switch circuits are electrically connected to the common voltage;

wherein the driving control logic circuit is configured to output a plurality of pulse-width modulation signals;

wherein the control terminals of the switch circuit receive the pulse-width modulation signals respectively.

11. A light strip unplugging protection method, comprising:

providing a light strip, wherein the light strip comprises a plug, and the plug comprises a power pin and at least one light strip control pin;

providing a socket corresponding to the plug, wherein the socket comprises a power pin holder and at least one light strip control pin holder, the power pin holder is configured to electrically connect to the power pin, and the at least one light strip control pin holder is configured to electrically connect to the light strip control pin;

using a pulse-width modulation signal to drive the light strip on the light strip control pin holder to control the current passing therethrough;

when the pulse-width modulation signal is in a first state, detecting voltage or current of the light strip control pin holder;

determining whether the light strip is unplugged according to the voltage or current; and when it is determined that the light strip is unplugged, turning off power voltage on the power pin holder.

12. The light strip unplugging protection method according to claim 11, further comprising:

providing a switch circuit, wherein a first terminal of the switch circuit is electrically connected to the light strip control pin holder, and a second terminal of the switch circuit is electrically connected to a common voltage;

when the pulse-width modulation signal is in the first state, controlling the first terminal of the switch circuit to be cut off from the second terminal of the switch circuit; and when the pulse-width modulation signal is in a second state, controlling the first terminal of the switch circuit is controlled to electrically connect the second terminal of the switch circuit.

13. The light strip unplugging protection method according to claim 11, wherein when the pulse-width modulation signal is in the first state, the step of detecting the voltage or current of the light strip control pin holder comprises:

providing a negative voltage source with low-driving capability; and when the pulse-width modulation signal is in the first state, turning on a circuit between the light strip control pin holder and the negative voltage source with low-driving capability, to detect a load of the light strip control pin holder.

* * * * *